US012727490B2

(12) United States Patent
Ecton et al.

(10) Patent No.: US 12,727,490 B2
(45) Date of Patent: Sep. 1, 2026

(54) FINE BUMP PITCH DIE TO DIE TILING INCORPORATING AN INVERTED GLASS INTERPOSER

(71) Applicant: Intel Corporation, Santa Clara, CA (US)

(72) Inventors: Jeremy D. Ecton, Gilbert, AZ (US); Brandon C. Marin, Gilbert, AZ (US); Srinivas V. Pietambaram, Chandler, AZ (US); Suddhasattwa Nad, Chandler, AZ (US); Leonel Arana, Phoenix, AZ (US)

(73) Assignee: Intel Corporation, Santa Clara, CA (US)

( * ) Notice: Subject to any disclaimer, the term of this patent is extended or adjusted under 35 U.S.C. 154(b) by 333 days.

(21) Appl. No.: 17/473,099

(22) Filed: Sep. 13, 2021

(65) Prior Publication Data

US 2023/0079607 A1 Mar. 16, 2023

(51) Int. Cl.
*H01L 23/498* (2006.01)
*G11C 5/06* (2006.01)
(Continued)

(52) U.S. Cl.
CPC ........... *H10W 70/611* (2026.01); *H10P 72/74* (2026.01); *H10W 70/05* (2026.01); *H10W 70/60* (2026.01);
(Continued)

(58) Field of Classification Search
CPC ............. H01L 23/5383; H01L 21/4857; H01L 21/6835; H01L 23/5386; H01L 24/08; H01L 2221/6835; H01L 2224/08225; H01L 2221/68345; H01L 2221/68359; H01L 23/49894; H01L 23/49816; H01L 23/49822; H01L 23/498; H01L 23/49838; H01L 23/49866; H01L 21/4853; H01L 23/12–15; H01L 2224/29188;
(Continued)

(56) References Cited

U.S. PATENT DOCUMENTS 3,726,002 A 4/1973 Greenstein et al.
9,449,935 B1 9/2016 Shih
(Continued)

FOREIGN PATENT DOCUMENTS

WO WO 2018/026771 A1 2/2018

OTHER PUBLICATIONS

Search Report from European Patent Application No. 22184014.3, mailed Jan. 24, 2023, 10 pgs.
(Continued)

*Primary Examiner* — Wael M Fahmy
*Assistant Examiner* — Aneesa Riaz Baig
(74) *Attorney, Agent, or Firm* — Schwabe, Williamson & Wyatt P.C.

(57) ABSTRACT

Embodiments disclosed herein include electronic packages and methods of assembling such electronic packages. In an embodiment, an electronic package comprises a first layer comprising glass. In an embodiment, conductive pillars are formed through the first layer, and a buildup layer stack is on the first layer. In an embodiment, conductive routing is provided through the buildup layer stack. In an embodiment, a second layer is over a surface of the buildup layer stack opposite from the glass layer.

20 Claims, 10 Drawing Sheets

(51) Int. Cl.

| | |
|---|---|
| ***H01L 21/768*** | (2006.01) |
| ***H01L 23/00*** | (2006.01) |
| ***H01L 23/495*** | (2006.01) |
| ***H10B 51/10*** | (2023.01) |
| ***H10B 51/20*** | (2023.01) |
| ***H10H 20/80*** | (2025.01) |
| ***H10H 20/852*** | (2025.01) |
| ***H10H 20/855*** | (2025.01) |
| ***H10H 20/856*** | (2025.01) |
| ***H10H 20/857*** | (2025.01) |
| ***H10P 72/70*** | (2026.01) |
| ***H10W 70/05*** | (2026.01) |
| ***H10W 70/60*** | (2026.01) |
| ***H10W 70/65*** | (2026.01) |
| ***H10W 70/685*** | (2026.01) |
| ***H10W 70/692*** | (2026.01) |
| ***H10W 76/42*** | (2026.01) |
| ***H10W 90/00*** | (2026.01) |

(52) U.S. Cl.

CPC ......... *H10W 70/65* (2026.01); *H10W 70/685* (2026.01); *H10W 70/692* (2026.01); *H10W 76/42* (2026.01); *H10P 72/7426* (2026.01); *H10W 90/794* (2026.01)

(58) Field of Classification Search

CPC . H01L 2224/48698; H01L 2224/48798; H01L 2224/48898; H01L 2224/8034; H10W 70/05; H10W 70/093; H10W 70/60; H10W 70/62; H10W 70/65; H10W 70/685; H10W 70/69; H10W 70/63; H10W 70/635; H10W 70/652; H10W 72/5522; H10W 72/59; H10W 72/953; H01W 70/692; H05K 1/0306; H05K 3/4605; H10P 14/2922

See application file for complete search history.

(56) References Cited

U.S. PATENT DOCUMENTS 9,922,845 B1 3/2018 Shih
10,290,571 B2* 5/2019 Yu ........................... H01L 24/20
11,078,112 B2* 8/2021 Dahlberg ................ H01L 23/15
2010/0051896 A1* 3/2010 Park ....................... H10B 63/10 257/E47.001
2011/0147055 A1* 6/2011 Ma .................... H01L 23/49822 29/830
2011/0304999 A1 12/2011 Yu
2013/0069251 A1* 3/2013 Kunimoto .............. H05K 1/112 257/784
2013/0119555 A1* 5/2013 Sundaram ............... H01L 23/15 257/774
2014/0002009 A1* 1/2014 Choi ..................... B60L 53/305 320/137
2014/0003009 A1* 1/2014 Ma ........................ H01L 21/486 174/262
2014/0073087 A1* 3/2014 Huang .................... H01L 21/56 438/107
2014/0085846 A1* 3/2014 Ma .......................... H01L 23/15 156/247
2015/0008586 A1 1/2015 Tsai
2015/0091182 A1* 4/2015 Chiu ....................... H01L 24/19 438/126
2015/0279815 A1* 10/2015 Do .................... H01L 23/49827 257/737
2016/0315024 A1* 10/2016 Lai .......................... H01L 23/15
2016/0319626 A1* 11/2016 Dille ....................... F16L 15/04
2016/0338202 A1* 11/2016 Park ........................ H01L 24/00
2018/0342451 A1* 11/2018 Dahlberg ............... B23K 26/06
2019/0057917 A1* 2/2019 Tsai ...................... H01L 21/565
2019/0088581 A1* 3/2019 Yu ....................... H01L 21/4857
2019/0131231 A1 5/2019 Lu
2019/0181112 A1 6/2019 Hu
2019/0237430 A1* 8/2019 England ................ H01L 21/486
2019/0319626 A1 10/2019 Dabral
2019/0326273 A1* 10/2019 Bhagavat .......... H01L 23/49816
2019/0341320 A1* 11/2019 Pollard ................. H01L 21/561
2019/0378820 A1 12/2019 Gao
2019/0385966 A1 12/2019 Gao
2020/0058592 A1* 2/2020 Kim .................... H01L 21/4857
2020/0111726 A1 4/2020 Bellman
2020/0118959 A1* 4/2020 Kim .................... H01L 21/4857
2021/0050251 A1* 2/2021 Hsiao ...................... H01L 24/83
2021/0202332 A1 7/2021 Hu
2021/0210359 A1* 7/2021 Brown .................... C03C 17/40
2021/0280521 A1 9/2021 Chen
2021/0305223 A1 9/2021 Shih
2022/0051972 A1* 2/2022 Kim .................. H01L 23/49894
2022/0394858 A1* 12/2022 Kamgaing ............ H01L 21/486
2022/0406696 A1* 12/2022 Aleksov ............ H01L 23/49838
2023/0077486 A1 3/2023 Ecton
2023/0078099 A1 3/2023 Ecton

OTHER PUBLICATIONS

Office Action for U.S. Appl. No. 17/473,111 mailed Mar. 11, 2025, 15 pgs.

Office Action for U.S. Appl. No. 17/473,414 mailed Jan. 6, 2025, 11 pgs.

Office Action for U.S. Appl. No. 17/473,414 mailed Sep. 26, 2024, 7 pgs.

Office Action for U.S. Appl. No. 17/473,111 mailed Nov. 5, 2024, 19 pgs.

Final Office Action for U.S. Appl. No. 17/473,414 mailed Apr. 25, 2025, 14 pgs.

Office Action for U.S. Appl. No. 17/473,111 mailed Jul. 17, 2025, 36 pgs.

Office Action for U.S. Appl. No. 17/473,414 mailed Dec. 4, 2025, 17 pgs.

Notice of Allowance for U.S. Appl. No. 17/473,111 mailed Mar. 9, 2026, 12 pgs.

* cited by examiner

FINE BUMP PITCH DIE TO DIE TILING INCORPORATING AN INVERTED GLASS INTERPOSER

TECHNICAL FIELD

Embodiments of the present disclosure relate to electronic packages, and more particularly to package substrates with hybrid bonding contacts or solder bonding contacts embedded in a glass interposer.

BACKGROUND

The demand for miniaturization of form factor and increased levels of integration for high performance are driving sophisticated packaging approaches in the semiconductor industry. Die partitioning enables miniaturization of small form factor and high performance without yield issues seen with other methods, but needs fine die to die interconnects. Embedded multi-die interconnect bridges (EMIB) enabled a lower cost and simpler 2.5D packaging approach for very high-density interconnects between heterogeneous dies on a single package. Instead of an expensive silicon interposer with through silicon vias (TSVs), a small silicon bridge chip is embedded in the package, enabling very high density die to die connections only where needed. Standard flip-chip assembly is used for robust power delivery and to connect high-speed signals directly from chip to the package substrate.

However, EMIB approaches suffer from a high cumulative bump thickness variation (BTV). Additionally, current bump-to-bump true position is challenging due to the poor dimensional stability of the organic core. A variety of solutions have been proposed including incorporating an organic patch on a temporary, rigid, glass carrier or permanent glass interposer embedded into the core of the substrate to reduce the total thickness variation (TTV) and reduce true position error to enable fine bump pitch connections.

EMBODIMENTS OF THE PRESENT DISCLOSURE

Figures 1A, 1B:
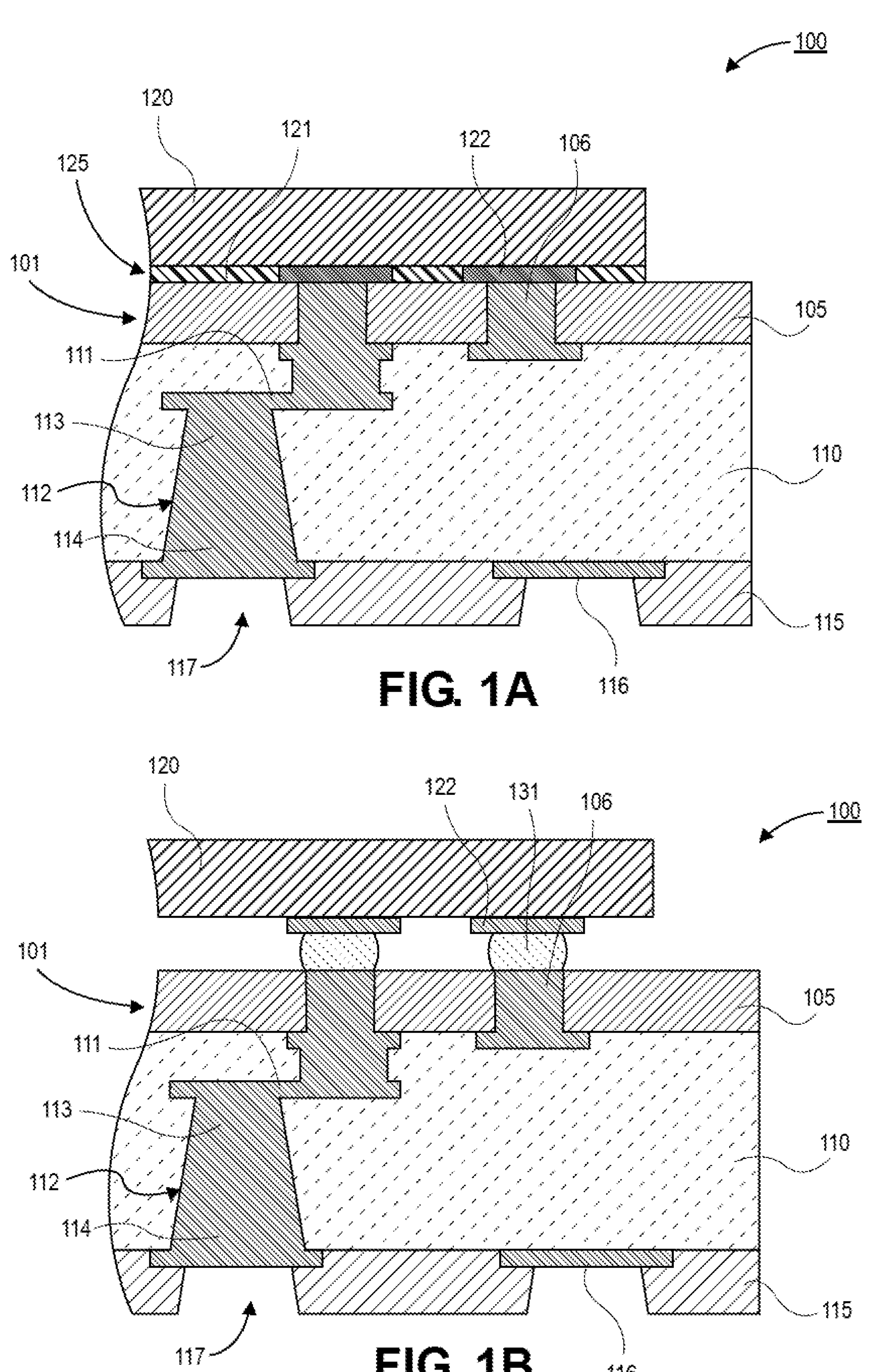
FIG. 1A is a cross-sectional illustration of an electronic package with hybrid bonding between a die and a package substrate with a glass layer on the package substrate side of the hybrid bond, in accordance with an embodiment.
FIG. 1B is a cross-sectional illustration of an electronic package with a die coupled to a package substrate with a glass layer at the first level interconnect (FLI) location.

Described herein are package substrates with hybrid bonding contacts embedded in a glass interposer, in accordance with various embodiments. In the following description, various aspects of the illustrative implementations will be described using terms commonly employed by those skilled in the art to convey the substance of their work to others skilled in the art. However, it will be apparent to those skilled in the art that the present invention may be practiced with only some of the described aspects. For purposes of explanation, specific numbers, materials and configurations are set forth in order to provide a thorough understanding of the illustrative implementations. However, it will be apparent to one skilled in the art that the present invention may be practiced without the specific details. In other instances, well-known features are omitted or simplified in order not to obscure the illustrative implementations.

Various operations will be described as multiple discrete operations, in turn, in a manner that is most helpful in understanding the present invention, however, the order of description should not be construed to imply that these operations are necessarily order dependent. In particular, these operations need not be performed in the order of presentation.

As noted above, embedded multi-die interconnect (EMIB) architectures have allowed for some high density interconnect architectures for heterogeneous die integration in electronic packages. However, EMIB architectures may no longer be adequate as devices continue to scale to smaller and more dense interconnects. Hybrid bonding architectures may allow for further reduction in interconnect pitch. Generally, hybrid bonding includes a bonding layer that comprises a conductive pad that is coplanar with a dielectric layer. The opposing device also has a similar bonding layer. The two devices (e.g., a package substrate and a die) are brought into contact with each other. At room temperature, the two dielectric layers begin to bond together. At elevated temperatures, the opposing pads undergo interdiffusion and permanently bond to each other. However, hybrid bonding has its own limitations as well. Particularly, tight control of the planarity between the pad and the dielectric layer are needed. As such, thickness variations attributable to organic packaging can make hybrid bonding difficult to implement.

One approach to improve hybrid bonding effectiveness is to use a first level interconnect (FLI) first assembly process. In such embodiments, the FLI layer is formed before the organic buildup layers. The FLI layer may be formed on a carrier. The buildup layers (including conductive routing) may then be built up from the FLI layer. However, when the carrier is ultimately removed, warpage may occur that negatively impacts the hybrid bonding.

Accordingly, embodiments disclosed herein include a hybrid bonding process that utilizes a reinforced hybrid bonding layer on the package substrate. Particularly, the hybrid bonding layer includes a glass layer with conductive pillars through the glass layer. The top surfaces of the conductive pillars are substantially coplanar with the top surface of the glass layer. The use of a glass layer provides mechanical support to the package substrate and mitigates warpage, even after the carrier is removed. As such, fine pitch interconnects can be made with FLI first hybrid bonding approaches.

In an embodiment, the glass layer is patterned before being attached to a carrier. It has been shown that laser assisted etching processes can be used to form high aspect ratio holes through the glass layer. The ability to form high aspect ratio features allows for thicker glass layers to be used. Using thicker glass increases the mechanical reinforcement of the package and improves the planarity of the hybrid bonding layer. For example, small pitch features (e.g., pitches of approximately 25 μm or smaller) can be formed in thick glass layers (e.g., with thicknesses up to approximately 200 μm). As used herein, "approximately" refers to a range that is within 10% of the stated value. For example "approximately 200 μm" may refer to a range between 180 μm and 220 μm.

Figure 1C:
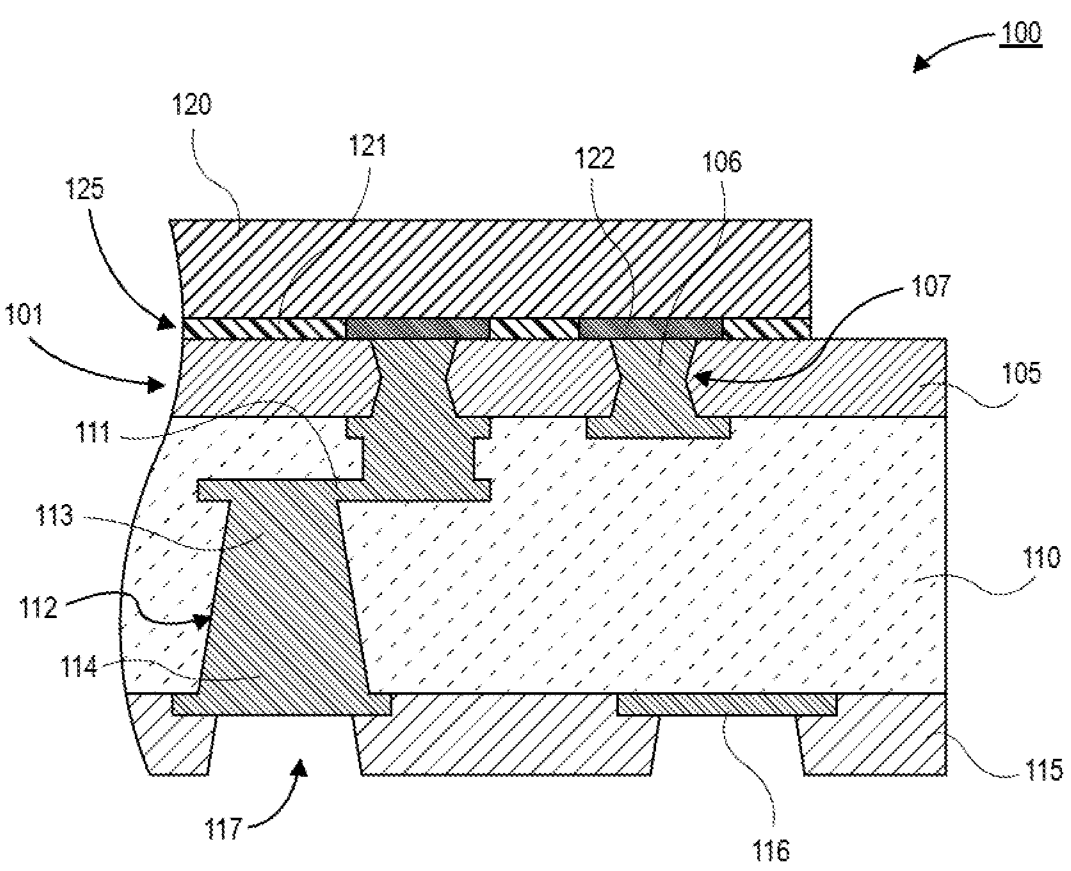
FIG. 1C is a cross-sectional illustration of an electronic package with hybrid bonding between a die and a package substrate with pillars through a glass layer that have non-vertical sidewalls, in accordance with an embodiment.

Referring now to FIGS. 1A-1C, cross-sectional illustrations of electronic packages 100 are shown, in accordance with various embodiments. In FIG. 1A a hybrid bonding approach is used. In FIG. 1B, the conductive pillars are coupled to the die by a solder. In FIG. 1C, the conductive pillars are shown with an hourglass shaped cross-section.

Referring now to FIG. 1A, a cross-sectional illustration of an electronic package 100 is shown, in accordance with an embodiment. In an embodiment, the electronic package 100 comprises a first hybrid bonding layer 101. The first hybrid bonding layer 101 may be over buildup layers 110 of the package substrate. The first hybrid bonding layer 101 may comprise a glass layer 105. The glass layer 105 may be any suitable glass formulation. In an embodiment, the glass layer 105 has a thickness that is up to approximately 200 μm thick. However, it is to be appreciated that the glass layer 105 may be even thicker in some embodiments.

The first hybrid bonding layer 101 may further comprise conductive pillars 106. For example, the conductive pillars 106 may be copper. In an embodiment, the conductive pillars 106 may extend substantially through an entire thickness of the glass layer 105. That is, a top surface of the conductive pillars 106 may be substantially coplanar with a top surface of the glass layer 105. As used herein, "substantially coplanar" may refer to two surfaces being within 5 μm of being perfectly coplanar. In an embodiment, the conductive pillars 106 may have a pitch that is approximately 25 μm or smaller. In a particular embodiment, the pitch of the conductive pillars 106 may be approximately 10 μm or smaller. While primarily directed to small pitch architectures, it is to be appreciated that embodiments also include pitches that are greater than 25 μm.

In an embodiment, a second hybrid bonding layer 125 of a die 120 is bonded to the first hybrid bonding layer 101. The second hybrid bonding layer 125 may comprise a dielectric layer 121 and conductive pads 122. The dielectric layer 121 may comprise a dielectric such as a silicon oxide (e.g., $SiO_2$). During the hybrid bonding process, the dielectric layer 121 bonds with the glass layer 105. In an embodiment, the conductive pads 122 may pass through the dielectric layer 121. The conductive pads 122 (e.g., copper pads 122) may have a bottom surface that is substantially coplanar with a bottom surface of the dielectric layer 121. During the hybrid bonding process the conductive pads 122 bond with the conductive pillars 106 through interdiffusion bonding.

In an embodiment, successful hybrid bonding between the first hybrid bonding layer 101 and the second hybrid bonding layer 125 is made possible due, at least in part, to the mechanical rigidity provided by the glass layer 105. The glass layer 105 serves as a package stiffener that counteracts any warpage that may be induced by the underlying buildup layers 110. As such, a highly planar interface is provided, which is a requirement of hybrid bonding architectures.

In an embodiment, the glass layer 105 may be provided over a stack of one or more buildup layers 110. The buildup layers 110 may be dielectric layers typical of electronics packaging architectures. In an embodiment, conductive features (e.g., traces 111, vias 112, pads, and the like) may be fabricated in the buildup layers 110. The conductive features may electrically couple conductive pillars 106 to pads 116 on an opposite side of the buildup layers 110. The pads 116 may be covered by a solder resist 115 with openings 117 to expose portions of the pads 116.

It is to be appreciated that the orientation of the conductive features in the buildup layers 110 are flipped 180 degrees relative to traditional orientations. That is, in a traditional package, the structures are fabricated from a bottom up process starting with the bottom second level interconnects and progressing up to the FLIs. However, in the electronic package 100, the structure is fabricated with an FLI first process. As such, the first hybrid bonding layer 101 is formed first and the buildup layers are formed over the first hybrid bonding layer 101. This results in via structures being flipped. As used herein a flipped via structure may refer to a via 112 that has a first end 113 that is closer to the glass layer 105 than a second end 114. The first end 113 has a width that is smaller than a width of the second end 114. In typical package structures, the wider end (i.e., the second end 114) would be closer to the FLI layer (e.g., the glass layer 105).

Referring now to FIG. 1B, a cross-sectional illustration of an electronic package 100 is shown, in accordance with an additional embodiment. In an embodiment, the electronic package 100 in FIG. 1B is substantially similar to the electronic package 100 in FIG. 1A, with the exception of the bonding architecture between the die 120 and the first hybrid bonding layer 101. Whereas the embodiment shown in FIG. 1A is a hybrid bonding architecture, the embodiment shown in FIG. 1B is a solder bonding architecture.

As shown, solder bumps 131 may be provided over the conductive pillars 106. The solder bumps 131 may be coupled to the pads 122 on the die 120. Such an embodiment may sometimes be referred to as a flip-chip bonding architecture. However, due to the fine pitch of the conductive pillars 106, denser interconnect architectures than traditional flip-chip bonding can be achieved. As will be described in greater detail below, the solder bumps 131 may be fabricated with plating processes over the conductive pillars 106.

Referring now to FIG. 1C, a cross-sectional illustration of an electronic package 100 is shown, in accordance with an additional embodiment. In an embodiment, the electronic package 100 is substantially similar to the electronic package 100 in FIG. 1A, with the exception of the structure of the conductive pillars 106. In FIG. 1A, the conductive pillars 106 have substantially vertical sidewalls. In the embodiment shown in FIG. 1C, the conductive pillars 106 have sloped sidewalls 107. As used herein, "substantially vertical" sidewalls may refer to sidewalls that are within 10° of being perfectly orthogonal relative to an underlying surfaces.

The sloped sidewalls 107 may be the result of the laser assisted etching process used to pattern the glass layer 105. In the particular embodiment shown in FIG. 1C, the sloped sidewalls 107 form an hourglass shaped cross-section. That is, a width of the conductive pillars 106 decreases towards the middle of the conductive pillars 106. Such an hourglass shaped cross-section may be formed when laser exposure is provided on both surfaces of the glass layer 105. Dual sided patterning may be useful to increase the attainable aspect ratio of the patterned features in the glass layer 105. For example, aspect ratios of approximately 10:1 or greater, or even 50:1 or greater are possible. Such high aspect ratios allow for low pitch (e.g., 25 μm or smaller) features to be fabricated in thick glass layers 105 (e.g., up to approximately 200 μm). As such, package substrates with improved planarity can be provided. In other embodiments, the laser exposure may be on a single surface of the glass layer 105, and the sidewall 107 may have a single slope through the height of the conductive pillar 106.

Referring now to FIGS. 2A-2I, a series of cross-sectional illustrations depicting a process for assembling an electronic package is shown, in accordance with an embodiment. The electronic package assembled in FIGS. 2A-2I may be substantially similar to the electronic package 100 that is shown in FIG. 1A.

Figure 2A:
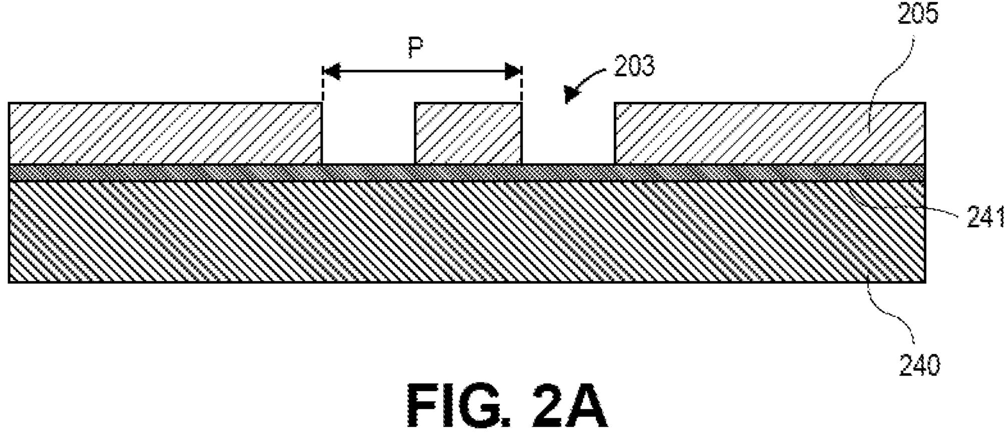
FIG. 2A is a cross-sectional illustration of a patterned glass layer over a carrier, in accordance with an embodiment.

Referring now to FIG. 2A, a cross-sectional illustration of a glass layer 205 is shown, in accordance with an embodiment. In an embodiment, the glass layer 205 may be secured to a carrier 240 by an adhesive 241. The adhesive 241 may be a temporary adhesive, such as a laser releasable bond film. As such, when the carrier 240 needs to be removed, a laser exposure through the carrier 240 can be used to release the glass layer 205. The carrier 240 may be a glass carrier in some embodiments.

In an embodiment, the glass layer 205 may be patterned before being attached to the carrier 240. For example, holes 203 may be formed through the glass layer 205. The holes 203 may have a pitch P. In an embodiment, the pitch P may be approximately 25 μm or less. The holes 203 may be high aspect ratio holes 203. For example, an aspect ratio (depth: width) may be approximately 10:1 or greater, or approximately 50:1 or greater. The high aspect ratio holes may be provided using a laser assisted etching process. While shown as having substantially vertical sidewalls, it is to be appreciated that the holes 203 may have sloped sidewalls. For example, the sidewalls may form an hourglass shaped hole 203, similar to the embodiment shown in FIG. 1C. In other embodiments, the glass layer 205 may be patterned after being attached to the carrier 240. In other embodiments, the pattern in the glass layer 205 may be formed without an additional carrier 240.

Figure 2B:
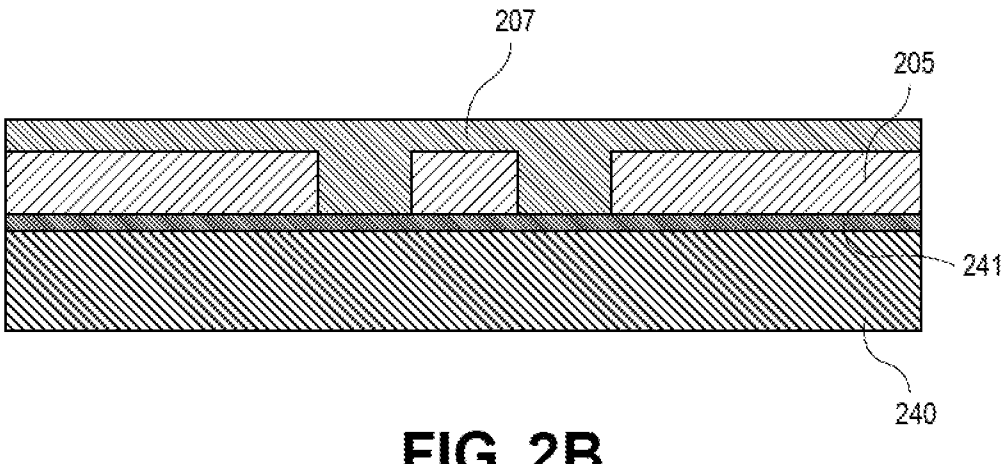
FIG. 2B is a cross-sectional illustration of the glass layer after a conductive layer is disposed over the patterned glass layer and into the openings, in accordance with an embodiment.

Referring now to FIG. 2B, a cross-sectional illustration of the glass layer 205 after deposition of a conductive layer 207 is shown, in accordance with an embodiment. In an embodiment, the conductive layer 207 fills the holes 203 and covers a top surface of the glass layer 205. In an embodiment, the conductive layer 207 may be any conductive material. For example, the conductive layer 207 may be a copper layer.

Figure 2C:
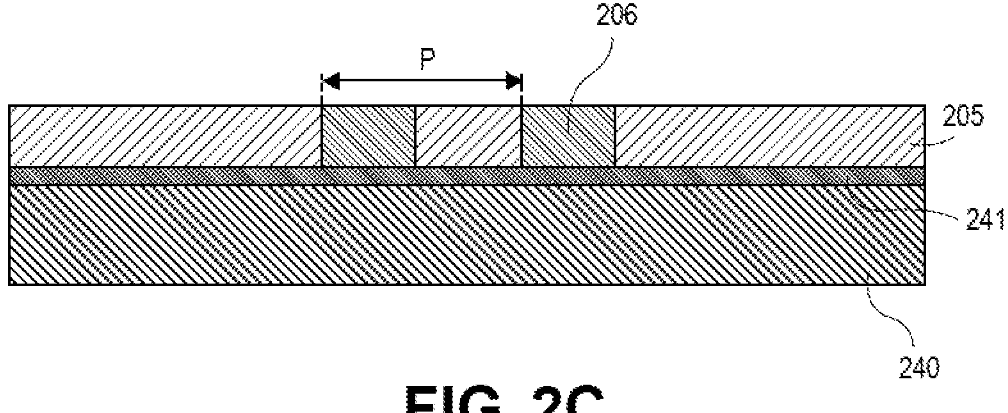
FIG. 2C is a cross-sectional illustration of the glass layer after the conductive layer is planarized with a top surface of the glass layer to define conductive pillars in the glass layer, in accordance with an embodiment.

Referring now to FIG. 2C, a cross-sectional illustration of the glass layer 205 after the conductive layer 207 is recessed is shown, in accordance with an embodiment. In an embodiment, the conductive layer 207 is recessed with a planarizing process, such as chemical mechanical planarization (CMP) or the like. The planarizing process results in the formation of the conductive pillars 206 within the holes 203. As such, the conductive pillars 206 have the same pitch P as the holes 203. In an embodiment, the conductive pillars 206 have top surfaces that are substantially coplanar with the top surface of the glass layer 205 and bottom surfaces that are substantially coplanar with the bottom surface of the glass layer 205.

Figure 2D:
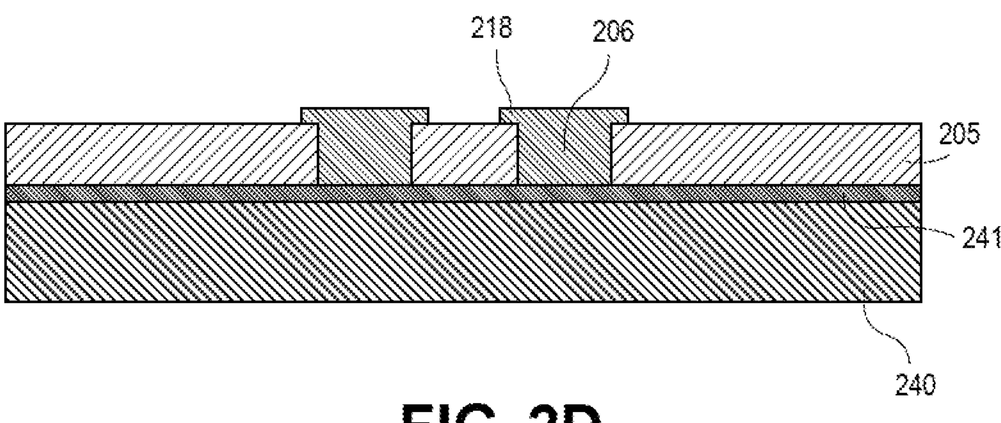
FIG. 2D is a cross-sectional illustration of the glass layer after pads are formed over the conductive pillars, in accordance with an embodiment.

Referring now to FIG. 2D, a cross-sectional illustration of the glass layer after formation of pads 218 is shown, in accordance with an embodiment. In an embodiment, the pads 218 may be positioned over the conductive pillars 206. The pads 218 may be formed with a deposition and patterning process, or any other patterning process typical of electronic packaging process flows. The pads 218 may be copper pads or another conductive material.

Figure 2E:
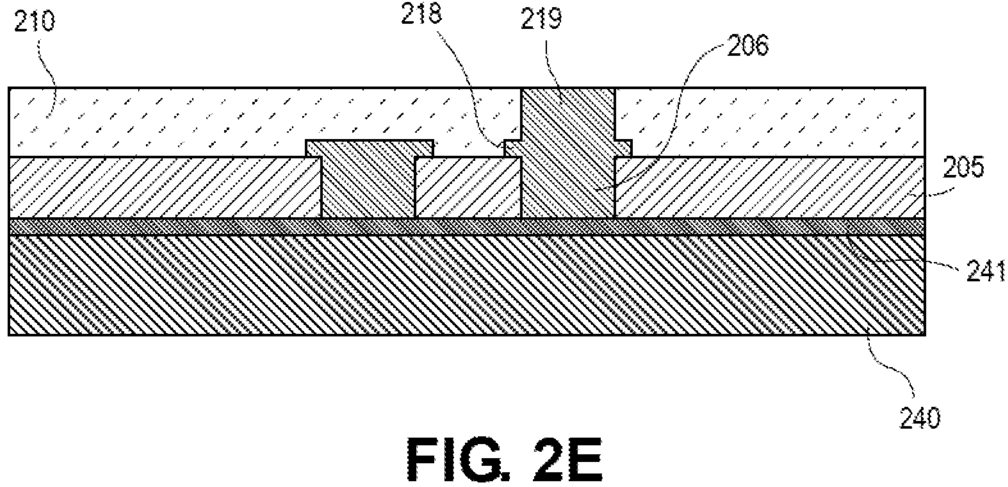
FIG. 2E is a cross-sectional illustration of the glass layer after a buildup layer is formed over the glass layer, in accordance with an embodiment.

Referring now to FIG. 2E, a cross-sectional illustration of the glass layer 205 after a buildup layer 210 is provided over the glass layer 205 is shown, in accordance with an embodiment. In an embodiment, a via 219 may be formed through the buildup layer 210 to provide a vertical connection to one of the pads 218. The via 219 may be formed with a lithographic process or a laser drilling process. In the illustrated embodiment, a lithographic process is shown, as indicated by the substantially vertical sidewalls of the via 219. The buildup layer 210 may be any suitable dielectric material typical of electronic packaging processes. For example, the buildup layer 210 may be a buildup film (BF), a photoimageable dielectric (PID), or the like. The via 219 may be a conductive material. For example, the via 219 may comprise copper.

Figure 2F:
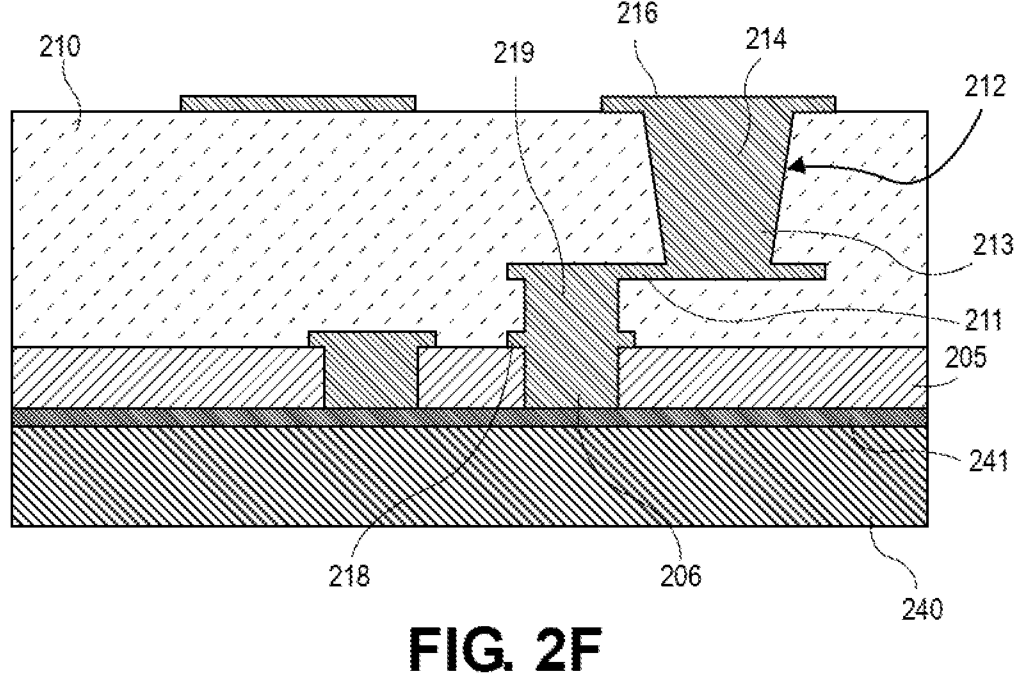
FIG. 2F is a cross-sectional illustration of the glass layer after additional buildup layers are formed over the glass layer, in accordance with an embodiment.

Referring now to FIG. 2F, a cross-sectional illustration of the glass layer 205 after more buildup layers 210 are formed is shown, in accordance with an embodiment. As shown, a trace 211 may provide lateral translation of the connection to the conductive pillar 206. An additional vertical connection is provided by a via 212. The via 212 may be formed with a laser patterning process. As a result of the laser patterning process, the via 212 may have a first end 213 with a first width and a second end 214 with a second width. The first width of the first end 213 may be smaller than the second width of the second end 214. The first end 213 may be closer to the glass layer 205 than the second end 214. Such an arrangement is atypical of existing electronic packages. That is, having the narrow end of the via 212 being closest to the FLI layer (i.e., the glass layer 205), is the result of the FLI first patterning process. In typical electronic packages, the FLI layer is formed last, and the underlying vias 212 in the buildup layers 210 have the wider end closest to the FLI layer. In an embodiment, the via 212 may be a conductive material, such as copper or the like.

In an embodiment, pads 216 may be provided over the topside surface of the buildup layers 210. The pads 216 may be used for second level interconnect (SLI) architectures. For example, the pads 216 may be suitable for solder ball interconnects, or the like. In an embodiment, the pads 216 have a pitch that is greater than the pitch P of the conductive pillars 206. The pads 216 may be a conductive material, such as copper or the like.

While shown with several vertical vias 219 and 212, it is to be appreciated that any number of vertical vias, traces, etc. may be provided between the pads 216 and the conductive pillars 206. That is, the stack of buildup layers 210 may include any number of layers and routing. Additionally, it is to be appreciated that other components may be embedded within the buildup layers 210. For example, bridge dies or other features may be embedded in the buildup layers and electrically coupled to one or more of the conductive pillars 206.

Figure 2G:
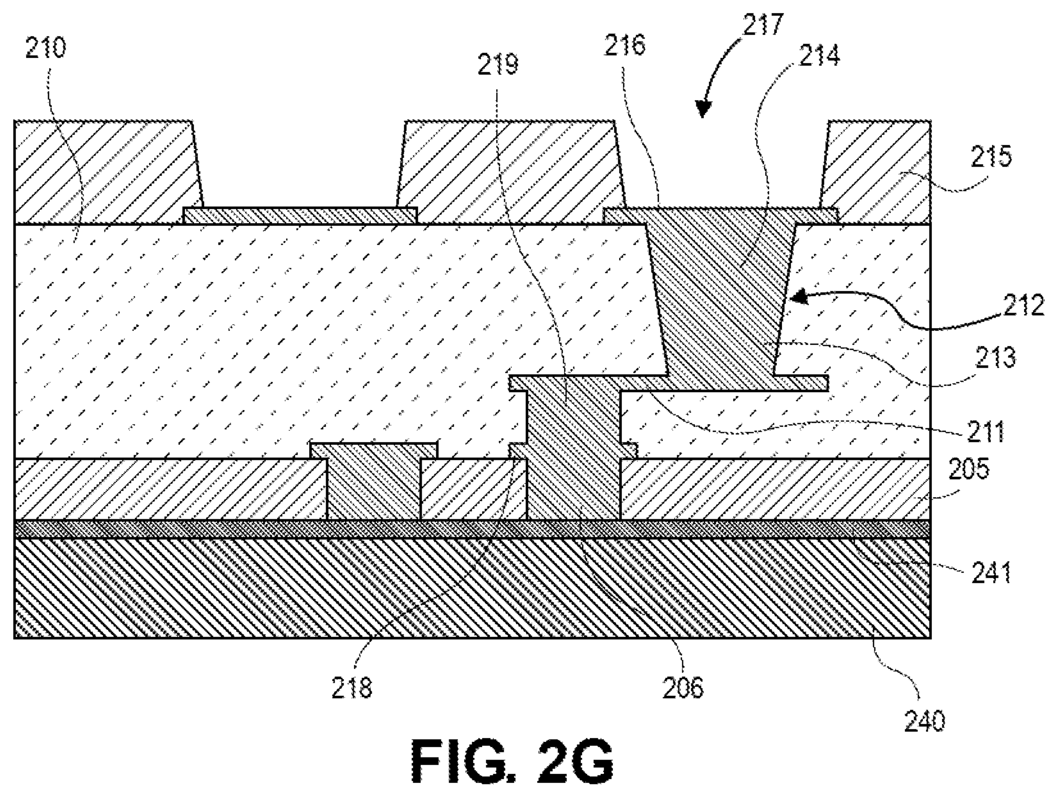
FIG. 2G is a cross-sectional illustration of the glass layer after a solder resist is disposed over the buildup layers, in accordance with an embodiment.

Referring now to FIG. 2G, a cross-sectional illustration of the structure after a solder resist 215 is disposed over the buildup layers 210 is shown, in accordance with an embodiment. The solder resist 215 may include openings 217 that expose portions of the pads 216. In some embodiments, the pads 216 may have barrier layers (not shown) or the like provided over the exposed portions of the pads 216. In an embodiment, the openings 217 may have sloped sidewalls as is typical of laser drilled openings.

Figure 2H:
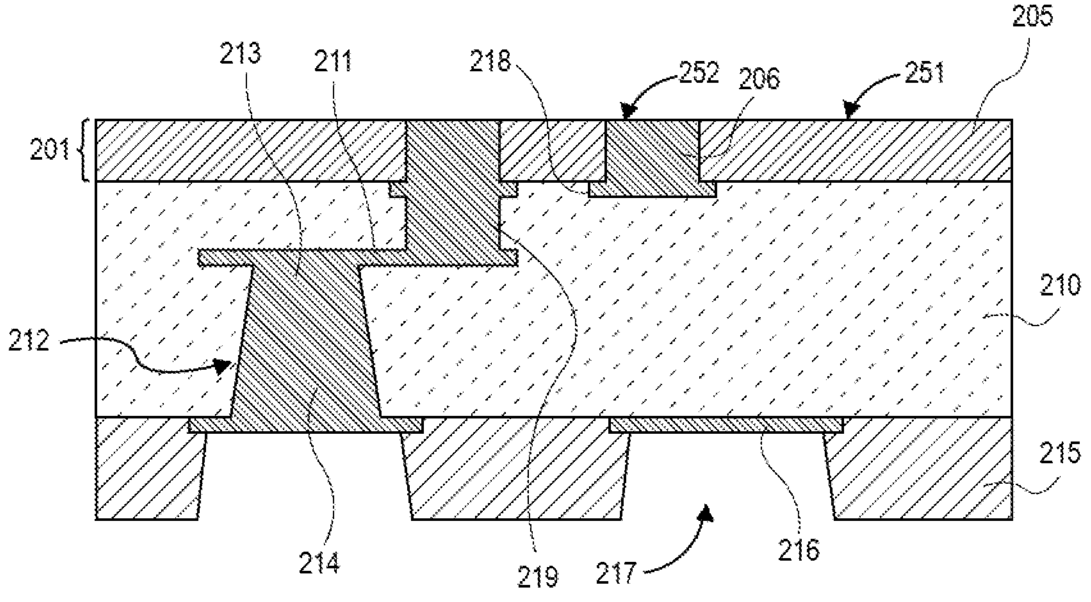
FIG. 2H is a cross-sectional illustration of the glass layer after the carrier is removed and the structure is flipped over, in accordance with an embodiment.

Referring now to FIG. 2H, a cross-sectional illustration of the structure after the carrier 240 is removed is shown, in accordance with an embodiment. In an embodiment, the carrier 240 may be removed by exposing the adhesive 241 to a laser through the back of the carrier 240. Removal of the carrier 240 results in the exposure of surfaces of the first hybrid bonding layer 201. As shown, first surfaces 252 of the conductive pillars 206 are substantially coplanar with a first surface 251 of the glass layer 205. In some embodiments, further polishing (e.g., CMP) or the like may be used to further modify the positioning of surfaces 252 with the surface 251. For example, in some embodiments, the first surfaces 252 of the conductive pillars 206 may be slightly recessed from the first surface 251 of the glass layer 205. For example, the recess may be on the order of one to several nanometers.

It is to be appreciated that even after removal of the carrier 240, planarity of the structure is substantially maintained. This is because the glass layer 205 serves as a stiffener that prevents warpage of the buildup layers 210 from negatively impacting the planarity of the device. The thickness of the glass layer 205 may be increased to provide improved mechanical rigidity. For example, the glass layer 205 may have a thickness of up to approximately 200 μm in some embodiments.

Figure 2I:
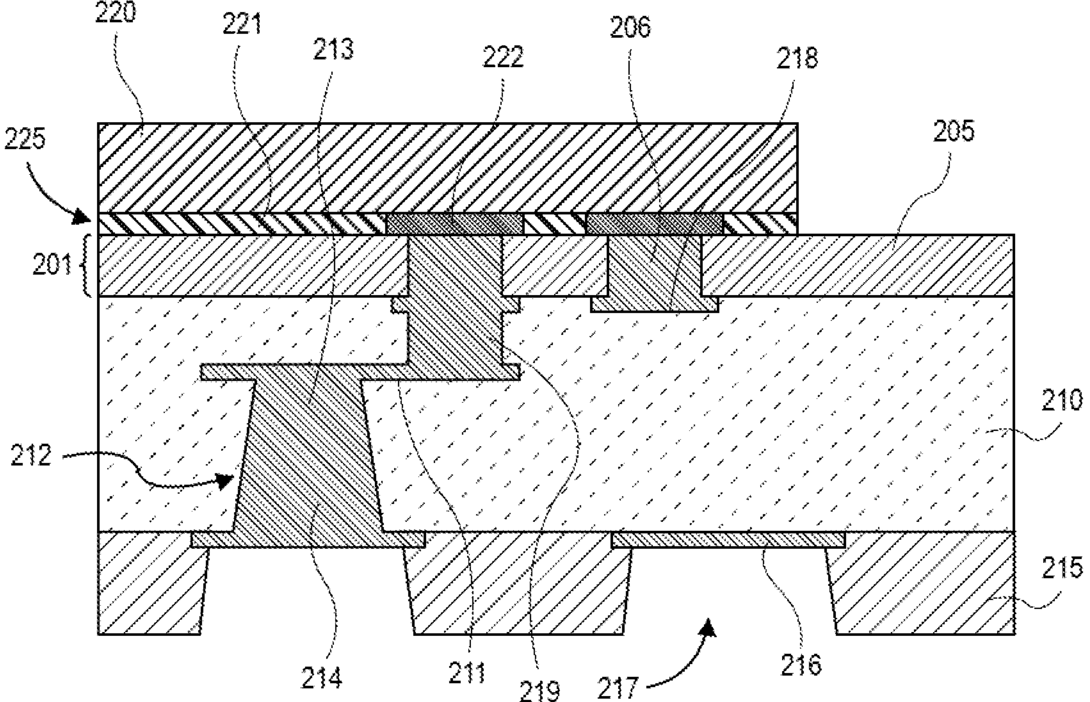
FIG. 2I is a cross-sectional illustration of the glass layer after being hybrid bonded to a die, in accordance with an embodiment.

Referring now to FIG. 2I, a cross-sectional illustration of the structure after a die 220 is adhered to the first hybrid bonding layer 201 is shown, in accordance with an embodiment. In an embodiment, the die 220 comprises a second hybrid bonding layer 225. The second hybrid bonding layer 225 comprises a dielectric layer 221 and pads 222. In an embodiment, the dielectric layer 221 is a silicon oxide, and the pads 222 are a conductive material, such as copper. At substantially room temperature, the dielectric layer 221 begins to bond with the glass layer 205. At elevated temperatures, the pads 222 and the conductive pillars 206 begin to undergo interdiffusion bonding. In some embodiments, the interdiffusion bonding is such that there may not be a visible seam at the interface between the pads 222 and the conductive pillars 206.

Figure 3A:
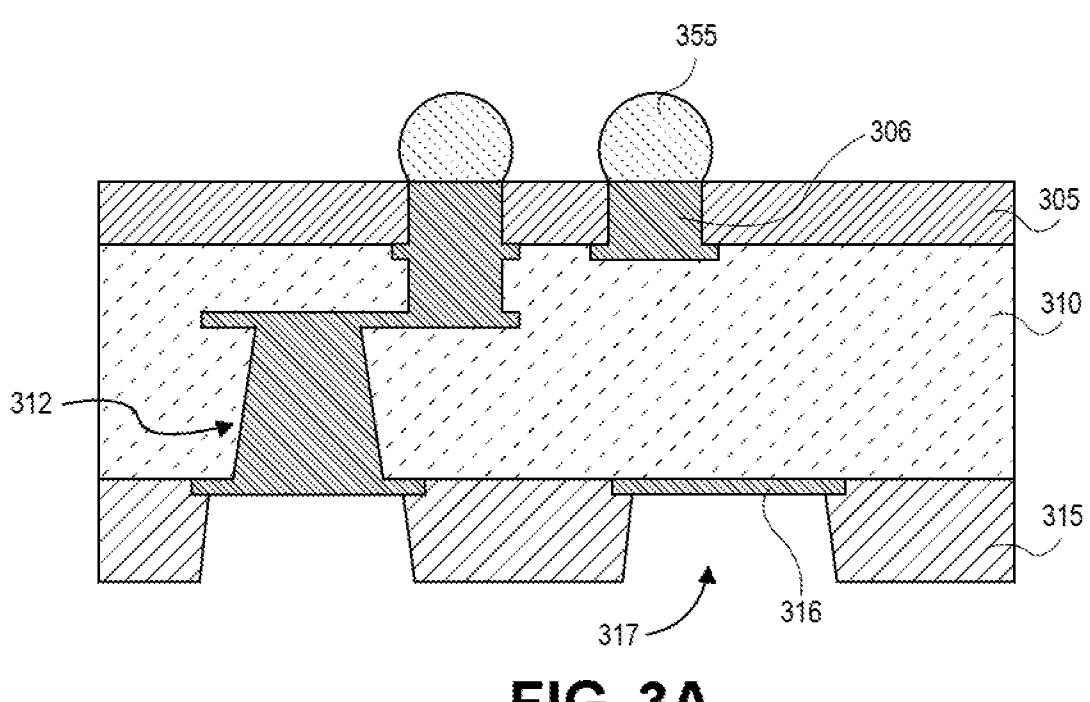
FIG. 3A is a cross-sectional illustration of a package substrate with solder over a FLI layer that comprises a glass layer and conductive pillars, in accordance with an embodiment.
Figure 3B:
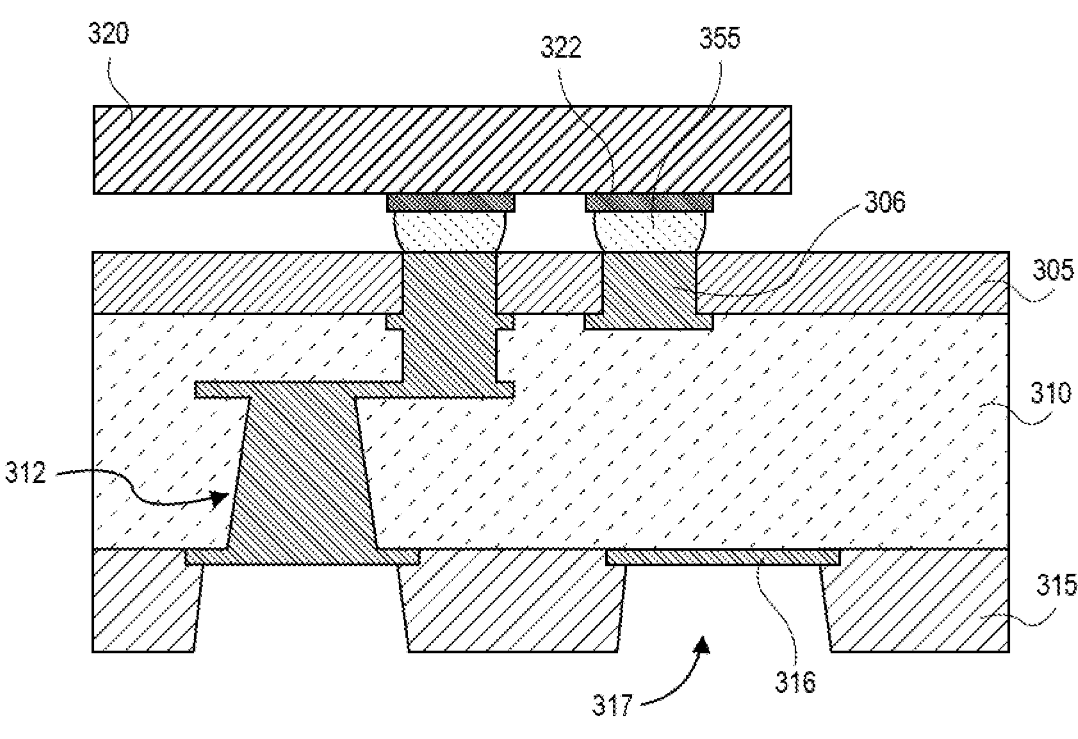
FIG. 3B is a cross-sectional illustration of the package substrate coupled to a die by the solder, in accordance with an embodiment.

Referring now to FIGS. 3A and 3B, cross-sectional illustrations depicting a process flow for assembling an electronic package using solder at the FLI is shown, in accordance with an additional embodiment. The processing operations implemented up to FIG. 3A are the same processing operations described with respect to FIGS. 2A-2H, and will not be repeated here in the interest of brevity.

Referring now to FIG. 3A, a cross-sectional illustration of an electronic package after the removal of the carrier and deposition of solder 355 is shown, in accordance with an embodiment. In an embodiment, the electronic package comprises an FLI layer that comprises a glass layer 305 with conductive pillars 306 through the glass layer 305. The glass layer 305 and the conductive pillars 306 may be substantially similar to the glass layer 205 and the conductive pillars 206 described above. In an embodiment, the solder 355 may be deposited with a plating and patterning process. For example, the process may include, a seed deposition, resist patterning, copper deposition, nickel deposition, and tin deposition. After depositing the tin, the resist may be stripped, and the seed layer etched. In some embodiments, a diffusion barrier layer (not shown) may also be provided between the pillars 306 and the solder 355.

In an embodiment, a stack of buildup layers 310 are provided below the glass layer 305. Similar to above, the FLI first assembly process results in the narrow end of the via 312 being closer to the glass layer 305 than the wide end of the via 312. The via 312 may be coupled to a pad 316 that is exposed by an opening 317 through a solder resist 315.

Referring now to FIG. 3B, a cross-sectional illustration of the structure after a die 320 is attached to the solder 355 is shown, in accordance with an embodiment. The solder 355 may couple the pads 322 on the die 320 with the conductive pillars 306 in the glass layer 305. That is, embodiments disclosed herein are not limited to hybrid bonding processes, and may also be used to provide flip-chip bonding as well.

Figure 4:
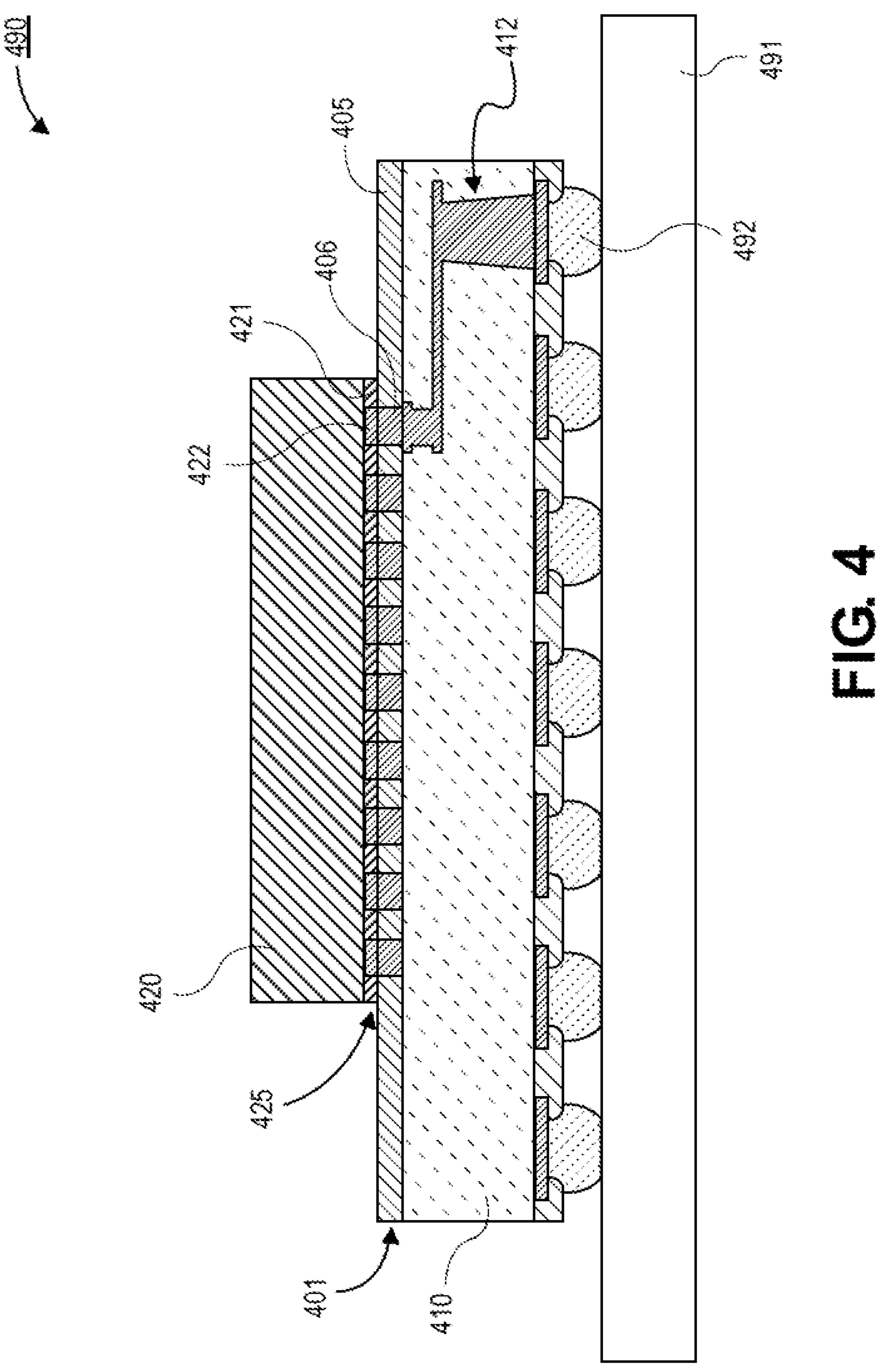
FIG. 4 is a cross-sectional illustration of an electronic system that comprises a package substrate with an FLI layer that comprises a glass layer and conductive pillars that is hybrid bonded to a die, in accordance with an embodiment.

Referring now to FIG. 4, a cross-sectional illustration of an electronic system 490 is shown, in accordance with an embodiment. In an embodiment, the electronic system 490 comprises a board 491, such as a printed circuit board (PCB) or the like. In an embodiment, the board 491 may be coupled to a package substrate by interconnects 492. The interconnects may be solder balls, sockets, or any other second level interconnect architecture.

In an embodiment, the package substrate comprises a first hybrid bonding layer 401. The first hybrid bonding layer 401 comprises a glass layer 405 and conductive pillars 406. The conductive pillars 406 may be coupled to the interconnects 492 through conductive routing through buildup layers 410 in the package substrate. For example, conductive routing may include a via 412. As shown, a narrow end of the via 412 may be closer to the glass layer 405 than a wide end of the via 412.

A die 420 may be bonded to the first hybrid bonding layer 401 by a second hybrid bonding layer 425. The second hybrid bonding layer 425 may include pads 422 that are bonded to the conductive pillars 406 by interdiffusion bonding. The second hybrid bonding layer 425 may also include a dielectric layer 425 that is bonded to the glass layer 405.

Figure 5:
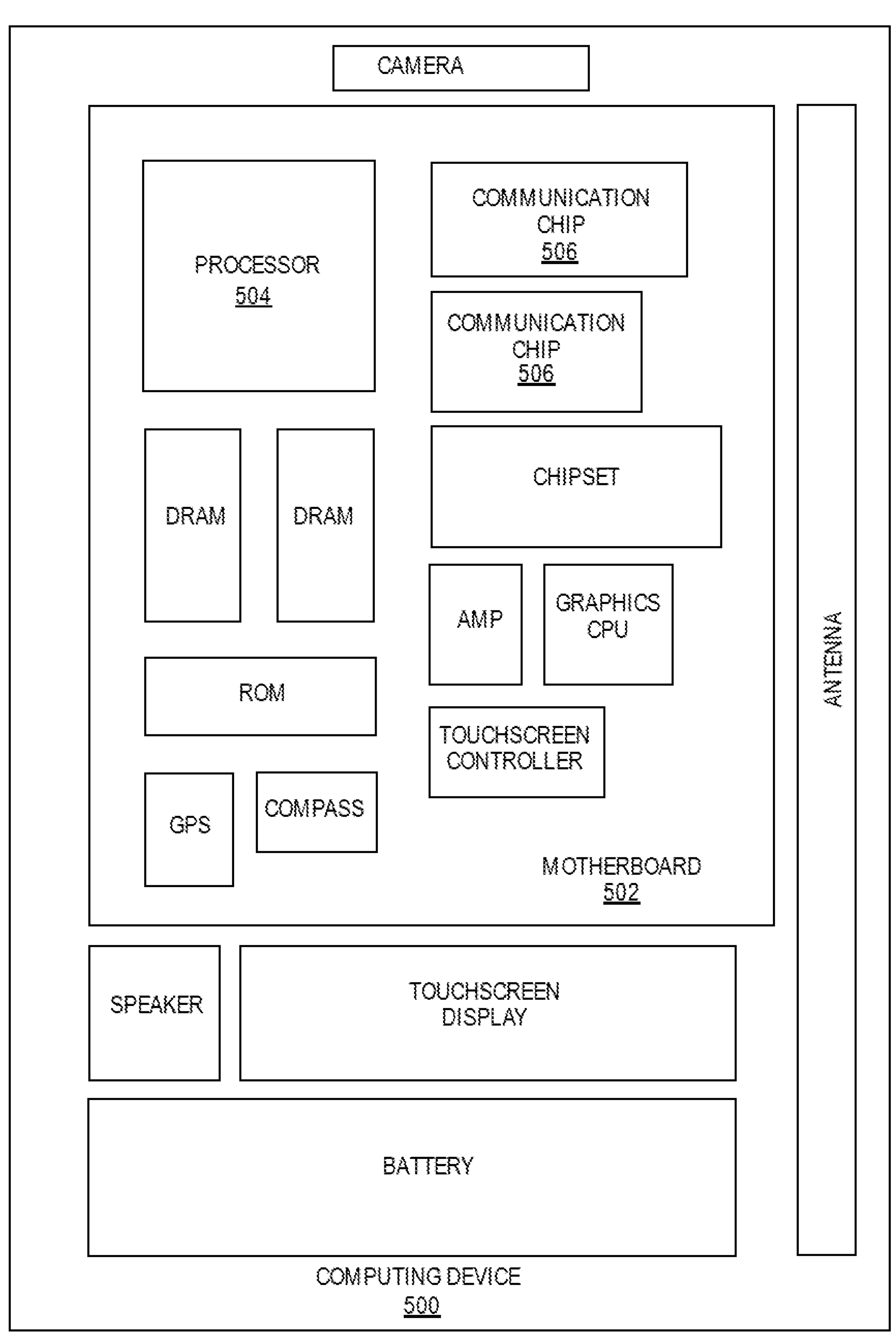
FIG. 5 is a schematic of a computing device built in accordance with an embodiment.

FIG. 5 illustrates a computing device 500 in accordance with one implementation of the invention. The computing device 500 houses a board 502. The board 502 may include a number of components, including but not limited to a processor 504 and at least one communication chip 506. The processor 504 is physically and electrically coupled to the board 502. In some implementations the at least one communication chip 506 is also physically and electrically coupled to the board 502. In further implementations, the communication chip 506 is part of the processor 504.

These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 506 enables wireless communications for the transfer of data to and from the computing device 500. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 506 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 500 may include a plurality of communication chips 506. For instance, a first communication chip 506 may be dedicated to shorter range wireless communications such as Wi-Fi and Bluetooth and a second communication chip 506 may be dedicated to longer range wireless communications such as GPS, EDGE, GPRS, CDMA, WiMAX, LTE, Ev-DO, and others.

The processor 504 of the computing device 500 includes an integrated circuit die packaged within the processor 504. In some implementations of the invention, the integrated circuit die of the processor may be part of an electronic package that comprises an FLI first package substrate that is hybrid bonded to the integrated circuit die, in accordance with embodiments described herein. The term "processor" may refer to any device or portion of a device that processes electronic data from registers and/or memory to transform that electronic data into other electronic data that may be stored in registers and/or memory.

The communication chip 506 also includes an integrated circuit die packaged within the communication chip 506. In accordance with another implementation of the invention, the integrated circuit die of the communication chip may be part of an electronic package that comprises an FLI first package substrate that is hybrid bonded to the integrated circuit die, in accordance with embodiments described herein.

The above description of illustrated implementations of the invention, including what is described in the Abstract, is not intended to be exhaustive or to limit the invention to the precise forms disclosed. While specific implementations of, and examples for, the invention are described herein for illustrative purposes, various equivalent modifications are possible within the scope of the invention, as those skilled in the relevant art will recognize.

These modifications may be made to the invention in light of the above detailed description. The terms used in the following claims should not be construed to limit the invention to the specific implementations disclosed in the specification and the claims. Rather, the scope of the invention is to be determined entirely by the following claims, which are to be construed in accordance with established doctrines of claim interpretation.

Example 1: an electronic package, comprising: a first layer comprising glass; conductive pillars through the first layer; a buildup layer stack on the first layer, wherein conductive routing is through the buildup layer stack; and a second layer over a surface of the buildup layer stack opposite from the first layer.

Example 2: electronic package of Example 1, wherein the conductive routing comprises at least one via.

Example 3: the electronic package of Example 2, wherein the via is a tapered via.

Example 4: the electronic package of Example 3, wherein the tapered via has a first end with a first width and a second end with a second width that is smaller than the first width, and wherein a distance between the second end and the first layer is smaller than a distance between the first end and the first layer.

Example 5: the electronic package of Examples 1-4, further comprising: a plurality of solder balls, wherein individual ones of the plurality of solder balls are provided over corresponding ones of the conductive pillars.

Example 6: the electronic package of Examples 1-5, wherein the conductive pillars have non-vertical sidewalls.

Example 7: the electronic package of Example 6, wherein the conductive pillars have an hourglass shaped cross-section.

Example 8: the electronic package of Examples 1-7, wherein a pitch of the conductive pillars is approximately 25 μm or smaller.

Example 9: the electronic package of Examples 1-8, wherein the first layer has a thickness that is approximately 200 μm or smaller.

Example 10: an electronic package, comprising: a die, wherein the die comprises: a first hybrid bonding layer; and a package substrate, wherein the package substrate comprises: a second hybrid bonding layer, comprising: a third layer comprising glass; and conductive pillars through the third layer, wherein the first hybrid bonding layer is coupled to the second hybrid bonding layer.

Example 11: the electronic package of Example 10, wherein the package substrate further comprises: a buildup layer stack on the third layer, wherein conductive routing is through the buildup layer stack.

Example 12: the electronic package of Example 11, wherein the conductive routing includes a via.

Example 13: the electronic package of Example 12, wherein the via has a first end with a first width and a second end with a second width that is smaller than the first width, and wherein the second end is closer to the third layer than the first end.

Example 14: the electronic package of Examples 10-13, wherein the conductive pillars have non-vertical sidewalls.

Example 15: the electronic package of Example 14, wherein the conductive pillars have an hourglass shaped cross-section.

Example 16: the electronic package of Examples 10-15, wherein a pitch of the conductive pillars is approximately 25 μm or smaller.

Example 17: the electronic package of Examples 10-16, wherein the third layer has a thickness that is approximately 200 μm or smaller.

Example 18: the electronic package of Examples 10-17, wherein the first hybrid bonding layer comprises: conductive pads; and a dielectric layer around the conductive pads.

Example 19: the electronic package of Example 18, wherein the dielectric layer is a silicon oxide.

Example 20: a method of forming an electronic package, comprising: forming openings through a glass layer; attaching the glass layer to a carrier; filling the openings with a conductive material to form conductive pillars; forming a buildup layer stack with conductive routing over the glass layer; and removing the carrier.

Example 21: the method of Example 20, further comprising: forming a solder resist layer over the buildup layer stack prior to removing the carrier.

Example 22: the method of Example 20 or Example 21, wherein the conductive routing comprises a via with a taper, wherein a first end of the via closest to the glass layer is narrower than a second end of the via.

Example 23: the method of Examples 20-22, wherein the glass layer has a thickness of approximately 200 μm or less, and wherein a pitch of the conductive pillars is approximately 25 μm or smaller.

Example 24: an electronic system, comprising: a board; a package substrate coupled to the board, wherein the package substrate comprises a first hybrid bonding layer with a glass layer and conductive pillars; and a die coupled to the package substrate, wherein the die comprises a second hybrid bonding layer, wherein the first hybrid bonding layer is connected to the second hybrid bonding layer.

Example 25: the electronic system of Example 24, wherein conductive routing in the package substrate comprises a via with a taper, wherein a first end of the via closest to the glass layer is narrower than a second end of the via.

What is claimed is:

1. An electronic package, comprising:

a first layer comprising glass;

conductive pillars through the first layer, wherein the conductive pillars are continuous from a top of the first layer comprising glass to a bottom of the first layer comprising glass, and wherein each of the conductive pillars has an hourglass shaped cross-section with an uppermost surface at a same level as the top of the first layer, and a bottommost surface at a same level as the bottom of the first layer;

a buildup layer stack on the first layer, wherein conductive routing is through the buildup layer stack;

a second layer over a surface of the buildup layer stack opposite from the first layer;

a hybrid bonding layer coupled to a side of the first layer opposite the buildup layer stack, the hybrid bonding layer comprising conductive pads in contact with the conductive pillars, and the hybrid bonding layer comprising a dielectric layer in contact with the glass of the first layer; and a plurality of solder balls, wherein individual ones of the plurality of solder balls are provided over corresponding ones of the conductive pillars.

2. The electronic package of claim 1, wherein the conductive routing comprises at least one via.

3. The electronic package of claim 2, wherein the via is a tapered via.

4. The electronic package of claim 3, wherein the tapered via has a first end with a first width and a second end with a second width that is smaller than the first width, and wherein a distance between the second end and the first layer is smaller than a distance between the first end and the first layer.

5. The electronic package of claim 1, wherein a pitch of the conductive pillars is approximately 25 μm or smaller.

6. The electronic package of claim 1, wherein the first layer has a thickness that is approximately 200 μm or smaller.

7. An electronic package, comprising:

a die, wherein the die comprises:

a second hybrid bonding layer, the second hybrid bonding layer comprising conductive pads and a dielectric layer; and a package substrate, wherein the package substrate comprises:

a first hybrid bonding layer, comprising:

a third layer comprising glass in contact with the dielectric layer of the second hybrid bonding layer; and conductive pillars through the third layer, wherein the conductive pillars are continuous from a top of the third layer to a bottom of the third layer, and wherein each of the conductive pillars has an hourglass shaped cross-section with an uppermost surface at a same level as the top of the third layer, and a bottommost surface at a same level as the bottom of the third layer, and wherein the first hybrid bonding layer is coupled to the second hybrid bonding layer, wherein the conductive pillars are in contact with the conductive pads of the second hybrid bonding layer.

8. The electronic package of claim 7, wherein the package substrate further comprises:

a buildup layer stack on the third layer, wherein conductive routing is through the buildup layer stack.

9. The electronic package of claim 8, wherein the conductive routing includes a via.

10. The electronic package of claim 9, wherein the via has a first end with a first width and a second end with a second width that is smaller than the first width, and wherein the second end is closer to the third layer than the first end.

11. The electronic package of claim 7, wherein a pitch of the conductive pillars is approximately 25 μm or smaller.

12. The electronic package of claim 7, wherein the third layer has a thickness that is approximately 200 μm or smaller.

13. The electronic package of claim 7, wherein the first hybrid bonding layer comprises:

conductive pads; and a dielectric layer around the conductive pads.

14. The electronic package of claim 13, wherein the dielectric layer is a silicon oxide.

15. A method of forming an electronic package, comprising:

forming openings through a glass layer;

attaching the glass layer to a carrier;

filling the openings with a conductive material to form conductive pillars, wherein the conductive pillars are continuous from a top of the glass layer to a bottom of the glass layer, and wherein each of the conductive pillars has an hourglass shaped cross-section with an uppermost surface at a same level as the top of the glass layer, and a bottommost surface at a same level as the bottom of the glass layer;

forming a buildup layer stack with conductive routing over the glass layer;

removing the carrier;

forming a hybrid bonding layer coupled to a side of the glass layer opposite the buildup layer stack, the hybrid bonding layer comprising conductive pads in contact with the conductive pillars, and the hybrid bonding layer comprising a dielectric layer in contact with the glass layer; and forming a plurality of solder balls, wherein individual ones of the plurality of solder balls are provided over corresponding ones of the conductive pillars.

16. The method of claim 15, further comprising:

forming a solder resist layer over the buildup layer stack prior to removing the carrier.

17. The method of claim 15, wherein the conductive routing comprises a via with a taper, wherein a first end of the via closest to the glass layer is narrower than a second end of the via.

18. The method of claim 15, wherein the glass layer has a thickness of approximately 200 μm or less, and wherein a pitch of the conductive pillars is approximately 25 μm or smaller.

19. An electronic system, comprising:

a board;

a package substrate coupled to the board, wherein the package substrate comprises a first hybrid bonding layer with a glass layer and conductive pillars, wherein the conductive pillars are continuous from a top of the glass layer to a bottom of the glass layer, and wherein each of the conductive pillars has an hourglass shaped cross-section with an uppermost surface at a same level as the top of the glass layer, and a bottommost surface at a same level as the bottom of the glass layer; and a die coupled to the package substrate, wherein the die comprises a second hybrid bonding layer, wherein the first hybrid bonding layer is connected to the second hybrid bonding layer, the second hybrid bonding layer comprising conductive pads in contact with the conductive pillars of the first hybrid bonding layer, and the second hybrid bonding layer comprising a dielectric layer in contact with the glass layer of the first hybrid bonding layer.

20. The electronic system of claim 19, wherein conductive routing in the package substrate comprises a via with a taper, wherein a first end of the via closest to the glass layer is narrower than a second end of the via.

* * * * *